(12) United States Patent
Anderson et al.

(10) Patent No.: US 9,048,217 B2
(45) Date of Patent: Jun. 2, 2015

(54) MIDDLE OF-LINE BORDERLESS CONTACT STRUCTURE AND METHOD OF FORMING

(71) Applicant: International Business Machines Corporation, Armonk, NY (US)

(72) Inventors: Brent A. Anderson, Jericho, VT (US); David V. Horak, Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/519,622

(22) Filed: Oct. 21, 2014

(65) Prior Publication Data
US 2015/0035026 A1    Feb. 5, 2015

Related U.S. Application Data

(62) Division of application No. 13/623,314, filed on Sep. 20, 2012, now Pat. No. 8,912,059.

(51) Int. Cl.
| | |
|---|---|
| H01L 21/336 | (2006.01) |
| H01L 29/417 | (2006.01) |
| H01L 29/78 | (2006.01) |
| H01L 29/66 | (2006.01) |
| H01L 29/45 | (2006.01) |
| H01L 21/3205 | (2006.01) |
| H01L 21/3213 | (2006.01) |
| H01L 29/76 | (2006.01) |

(52) U.S. Cl.
CPC ......... *H01L 29/41783* (2013.01); *H01L 29/78* (2013.01); *H01L 29/6656* (2013.01); *H01L 29/45* (2013.01); *H01L 21/32053* (2013.01); *H01L 21/32133* (2013.01)

(58) Field of Classification Search
CPC ............... H01L 21/32053; H01L 21/32133; H01L 29/45; H01L 29/6656
USPC .......... 438/197, 300, 649, 655, 682; 257/288, 257/E21.439, 619, 634
See application file for complete search history.

(56) References Cited

U.S. PATENT DOCUMENTS

| | | | |
|---|---|---|---|
| 5,882,992 | A | 3/1999 | Kobeda et al. |
| 5,888,894 | A | 3/1999 | Kong et al. |
| 6,162,694 | A | 12/2000 | Cheek et al. |
| 6,200,866 | B1 | 3/2001 | Ma et al. |
| 6,498,096 | B2 | 12/2002 | Bruce et al. |

(Continued)

OTHER PUBLICATIONS

U.S. Appl. No. 13/623,314, Notice of Allowance dated Aug. 8, 2014.

*Primary Examiner* — Long K Tran
(74) *Attorney, Agent, or Firm* — Michael LeStrange; Hoffman Warnick LLC

(57) ABSTRACT

Various embodiments disclosed include semiconductor structures and methods of forming such structures. In one embodiment, a method includes: providing a semiconductor structure including: a substrate; at least one gate structure overlying the substrate; and an interlayer dielectric overlying the substrate and the at least one gate structure; removing the ILD overlying the substrate to expose the substrate; forming a silicide layer over the substrate; forming a conductor over the silicide layer and the at least one gate structure; forming an opening in the conductor to expose a portion of a gate region of the at least one gate structure; and forming a dielectric in the opening in the conductor.

8 Claims, 10 Drawing Sheets

(56) References Cited

U.S. PATENT DOCUMENTS

| | | |
|---|---|---|
| 7,867,863 B2 | 1/2011 | Chang |
| 8,035,165 B2 | 10/2011 | Yeh et al. |
| 8,048,790 B2 | 11/2011 | Soss et al. |
| 8,450,169 B2 * | 5/2013 | Kwon et al. .......... 438/216 |
| 2006/0148182 A1 | 7/2006 | Datta et al. |
| 2012/0132998 A1 * | 5/2012 | Kwon et al. .......... 257/369 |
| 2013/0193522 A1 * | 8/2013 | Kwon et al. .......... 257/369 |

* cited by examiner

MIDDLE OF-LINE BORDERLESS CONTACT STRUCTURE AND METHOD OF FORMING

FIELD

The subject matter disclosed herein relates to semiconductor structures. More specifically, the subject matter disclosed herein relates to forming of semiconductor structures and the structures so formed.

BACKGROUND

In the formation of semiconductor devices, it is beneficial to provide both desired electrical contact between certain regions of the devices formed and also to prevent contact between various other regions of the devices formed on the substrate. One technique for accomplishing this has been by using photoresist and masking techniques wherein those areas to be exposed for electrical contact are patterned in the photoresist, and then by developing the patterned photoresist, to thereby expose the desired underlying regions. This technique normally utilizes several successive masks to perform the entire process, and in its performance each succeeding mask must be precisely aligned. However, as the technology advances, allowing for formation of smaller and smaller devices, it is increasingly difficult to maintain precise overlay tolerance, with the result that even small misalignments of the masks will result in the exposure of small portions or "borders" of regions that are intended to remain covered. Hence, electrical connections, e.g. by an overlay deposition of a metal, may connect not only the desired locations, but also those exposed border portions of the undesired locations.

In view of this, what has been referred to as borderless contacts have been fabricated. However, in the case of for instance SRAM cells, a limiting factor for shrinking the cells is the contact to diffusion with respect to gate-conductor. This limiting factor ensures that the diffusion contact does not short to the gate conductor. This has been achieved by simply providing ample distance between the diffusion contacting gate such that the contact does not intersect the gate within the process tolerances employed. Borderless contact allows the intersection of a contact to a "border" in the case of a SRAM cell being the gate, by providing means to prevent electrical shorts if the contact intersects the border, thereby permitting the distance between the border and the contact to be reduced. In addition, in a borderless contact it is necessary to contact the borderless element itself such as in the case of a SRAM cell permit contact to the gate conductor. To accomplish this, a separate gate contact mass has previously been used, but this adds another mask step. Additionally, the separate gate contact mass creates further size and overlay tolerance issues. As such, the conventional approaches for forming borderless contacts can fail to provide adequate spacing between the gate and the contact to prevent shorting. These conventional approaches can thereby limit the size of the contacts formed.

BRIEF SUMMARY

Various embodiments disclosed include semiconductor structures and methods of forming such structures. In one embodiment, a method includes: providing a semiconductor structure including: a substrate; at least one gate structure overlying the substrate; and an interlayer dielectric overlying the substrate and the at least one gate structure; removing the ILD overlying the substrate to expose the substrate; forming a silicide layer over the substrate; forming a conductor over the silicide layer and the at least one gate structure; forming an opening in the conductor to expose a portion of a gate region of the at least one gate structure; and forming a dielectric in the opening in the conductor.

A first aspect of the invention includes a method including: providing a semiconductor structure including: a substrate; at least one gate structure overlying the substrate, the at least one gate structure having: a gate region contacting the substrate; a set of spacers adjacent to the gate region and contacting the substrate; and a replacement metal gate (RMG) material cap overlying the gate region between the set of spacers; and an interlayer dielectric (ILD) overlying the substrate and substantially surrounding the at least one gate structure; removing the ILD overlying the substrate to expose the substrate; forming a silicide layer over the substrate; forming a conductor over the silicide layer and the at least one gate structure; forming an opening in the conductor to expose a portion of the gate region; and forming a dielectric in the opening in the conductor.

A second aspect of the invention includes a method including: providing a semiconductor structure including: a substrate; at least one gate structure overlying the substrate; and an interlayer dielectric overlying the substrate and the at least one gate structure; removing the ILD overlying the substrate to expose the substrate; forming a raised source-drain region over the exposed substrate proximate the at least one gate structure; forming a silicide layer over the raised source-drain region; forming a conductor over the silicide layer and the at least one gate structure; forming an opening in the conductor to expose a portion of a gate region of the at least one gate structure; and forming a dielectric in the opening in the conductor.

A third aspect of the invention includes a semiconductor structure having: a substrate; at least one gate structure overlying the substrate, the at least one gate structure having: a gate region contacting the substrate; a set of spacers adjacent to the gate region and contacting the substrate; and a replacement metal gate (RMG) cap overlying a first portion of the gate region between the set of spacers; a contact layer contacting the RMG cap and at least one of the set of spacers; and a dielectric contacting a second portion of the gate region between the set of spacers, the dielectric extending beyond the RMG cap to contact the second portion of the gate region.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
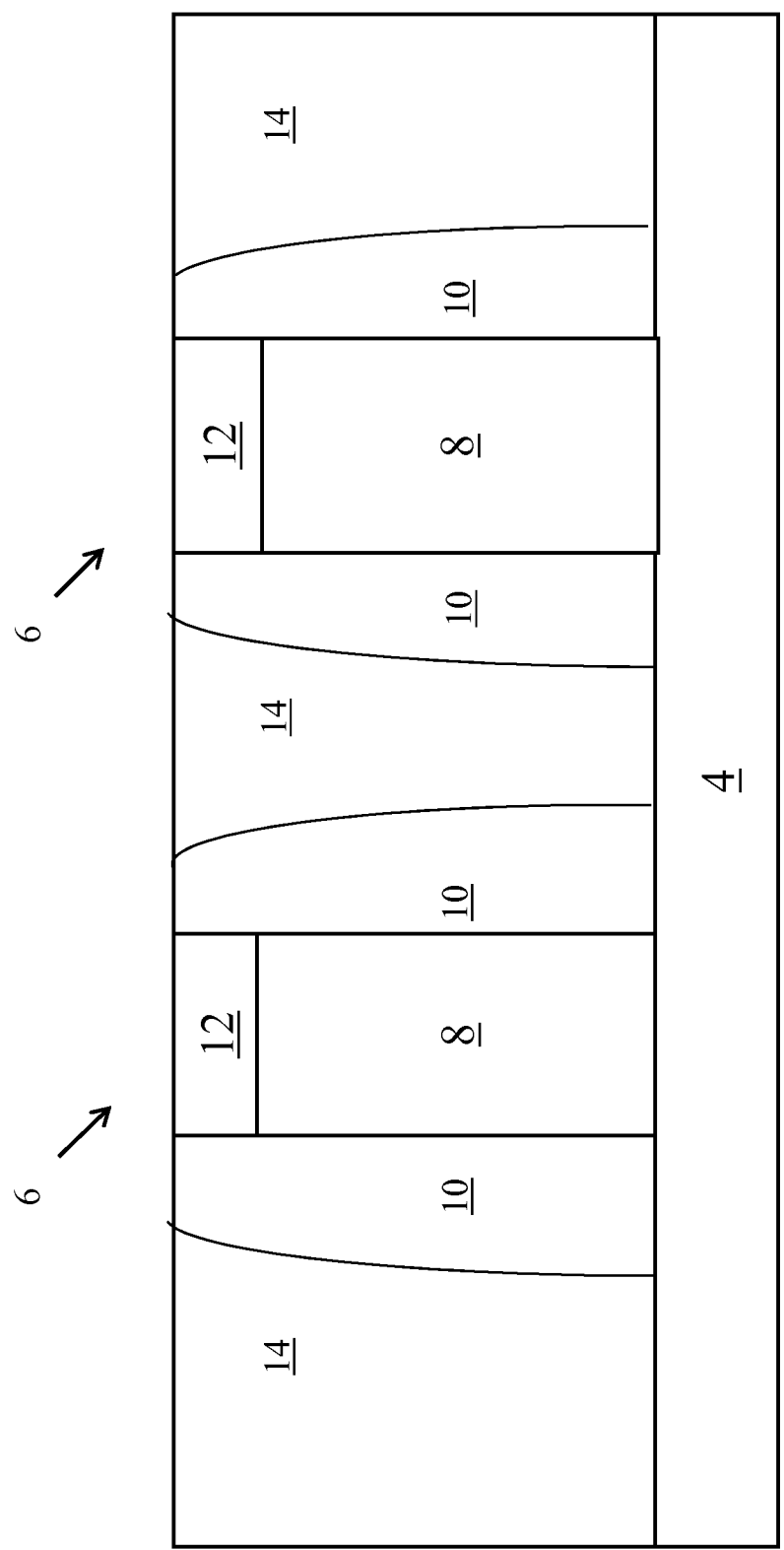
FIGS. 1-7 depict cross-sectional schematic views of precursor semiconductor structures undergoing processes according to various embodiments of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit structures. More specifically, the subject matter disclosed herein relates to forming of integrated circuit structures and the structures so formed.

As described herein, the conventional approaches for forming borderless contacts can fail to provide adequate spacing between the gate and the contact to prevent shorting. These conventional approaches can thereby limit the size of the contacts formed.

In contrast to these conventional approaches, various embodiments of the invention include processes of forming semiconductor structures by blanket forming a contact layer on a previously capped gate structure. This blanket-formed contact layer can then be etched to isolate the contacts from one another. In various embodiments, the etching of the contact layer extends through the cap over the gate structure and to the gate. The etched openings can then be filled with a dielectric. This approach differs from many conventional approaches which attempt to form the contact material after forming openings between semiconductor elements. In various embodiments of the invention, the contact material (e.g., a metal such as tungsten), is etched using a fluorine gas, a chlorine gas, or a combination of conventional etching gases.

A first particular aspect of the invention includes a method including: providing a semiconductor structure including: a substrate; at least one gate structure overlying the substrate, the at least one gate structure having: a gate region contacting the substrate; a set of spacers adjacent to the gate region and contacting the substrate; and a replacement metal gate (RMG) material cap overlying the gate region between the set of spacers; and an interlayer dielectric (ILD) overlying the substrate and substantially surrounding the at least one gate structure; removing the ILD overlying the substrate to expose the substrate; (optionally) forming a raised source-drain region over the exposed substrate proximate the at least one gate structure; forming a silicide layer over the substrate (or, in the case that the process includes forming a raised source-drain region, forming the silicide over that raise source-drain); forming a conductor over the silicide layer and the at least one gate structure; forming an opening in the conductor to expose a portion of the gate region; and forming a dielectric in the opening in the conductor.

A second particular aspect of the invention includes a method including: providing a semiconductor structure including: a substrate; at least one gate structure overlying the substrate; and an interlayer dielectric overlying the substrate and the at least one gate structure; removing the ILD overlying the substrate to expose the substrate; forming a raised source-drain region over the exposed substrate proximate the at least one gate structure; forming a silicide over the raised source-drain region; forming a conductor over the silicide and the at least one gate structure; forming an opening in the conductor to expose a portion of a gate region of the at least one gate structure; and forming a dielectric in the opening in the conductor.

A third particular aspect of the invention includes a semiconductor structure having: a substrate; at least one gate structure overlying the substrate, the at least one gate structure having: a gate region contacting the substrate; a set of spacers adjacent to the gate region and contacting the substrate; and a replacement metal gate (RMG) material cap overlying a first portion of the gate region between the set of spacers; a contact layer contacting the RMG material cap and at least one of the set of spacers; and a dielectric contacting a second portion of the gate region between the set of spacers, the dielectric extending beyond the RMG material cap to contact the second portion of the gate region.

Turning to FIGS. 1-7, schematic cross-sectional views of precursor semiconductor structures are shown undergoing processes according to various embodiments of the invention. FIG. 8 shows a semiconductor structure formed after completion of those processes.

Turning particularly to FIG. 1, a first process of providing a semiconductor structure 2 is illustrated. The semiconductor structure 2 can include a substrate 4, which can include any conventional semiconductor substrate material including but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 4 may be strained.

Overlying the substrate 4 is at least one gate structure 6 (two shown). The at least one gate structure 6 can be formed according to conventional techniques, e.g., masking, etching, deposition, etc. prior to the processes described according to the various embodiments of the invention. As used herein, and unless otherwise noted, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

In any case, returning to FIG. 1, the at least one gate structure 6 can include a gate region 8 contacting the substrate 4. As is known in the art, the gate region 8 can include a conductive material such as a metal for allowing current to pass therethrough when the at least one gate structure 6 is used as part of a semiconductor device (e.g., a memory device). Adjacent the gate region are a set of spacers 10 which also contact the substrate 4. The set of spacers 10 can include an insulating material capable of preventing conductive contact between the gate region 8 and potential conductive sources proximate the set of spacers 10.

Also shown, the at least one gate structure 6 can include a replacement metal gate (RMG) material cap 12 overlying the gate region 8 between the set of spacers 10. The RMG material cap 12 can include, in some cases, $Si_3N_4$, $Al_3O_2$, or $SiO_2$. The RMG material cap 12 can be formed according to conventional processes such as masking and deposition, etc.

Overlying the substrate 4 and substantially surrounding the at least one gate structure 6 is an interlayer dielectric (ILD) 14. The ILD 14 can include one or more conventional dielectric materials such as: silicon nitride ($Si_3N_4$), silicon oxide ($SiO_2$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Figure 2:
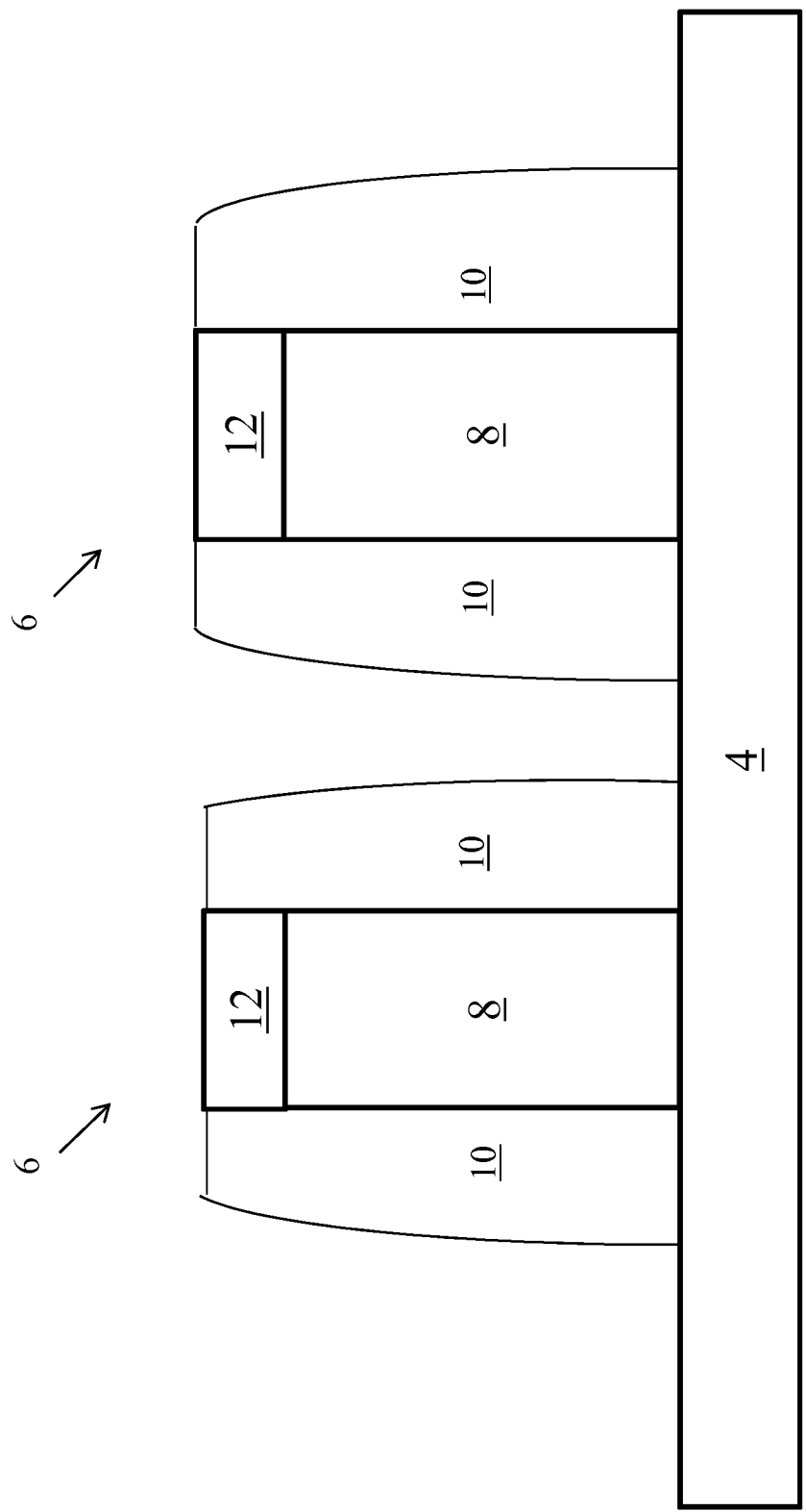

FIG. 2 illustrates a process according to various embodiments: removing the ILD 14 overlying the substrate 4 to expose the substrate 4. The ILD 14 can be removed by any conventional means, e.g., using an etching or bath-based removal technique known in the art.

Figure 3:
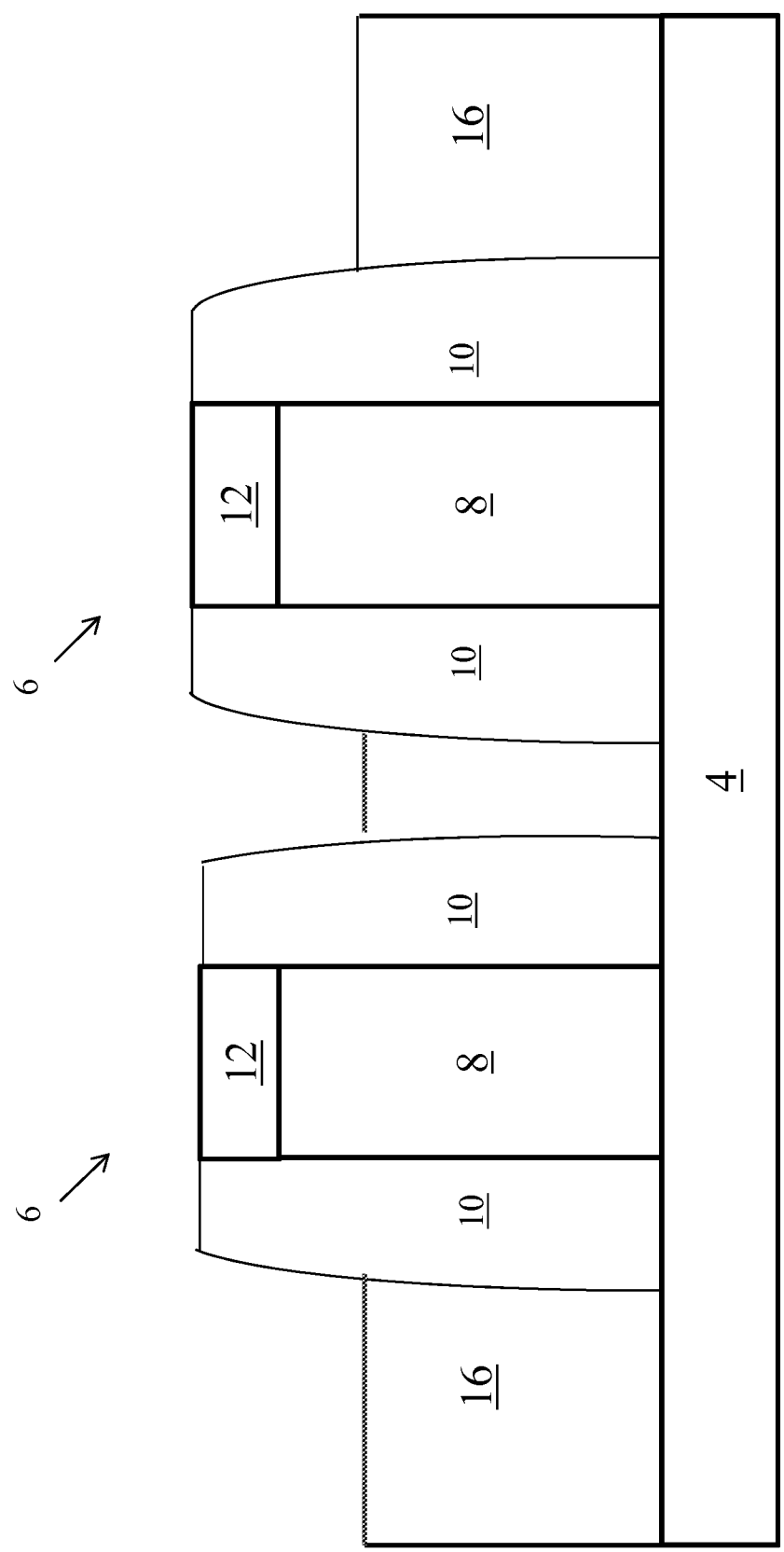

FIG. 3 illustrates an optional process according to various embodiments: forming a source-drain region 16 (a raised source-drain region) over the exposed substrate 4 proximate the at least one gate structure 6. In this case, the source-drain region 16 includes a "raised" source-drain region which extends above the substrate and along the outer surface of the sidewalls 10. The source-drain region 16 can be formed, e.g., of a silicon or other insulator, the source-drain region 16 is blanket formed (e.g., deposited and/or epitaxially grown) over the exposed substrate 4. As noted herein, forming of the raised source-drain region 16 is optional in some embodiments.

Figure 4:
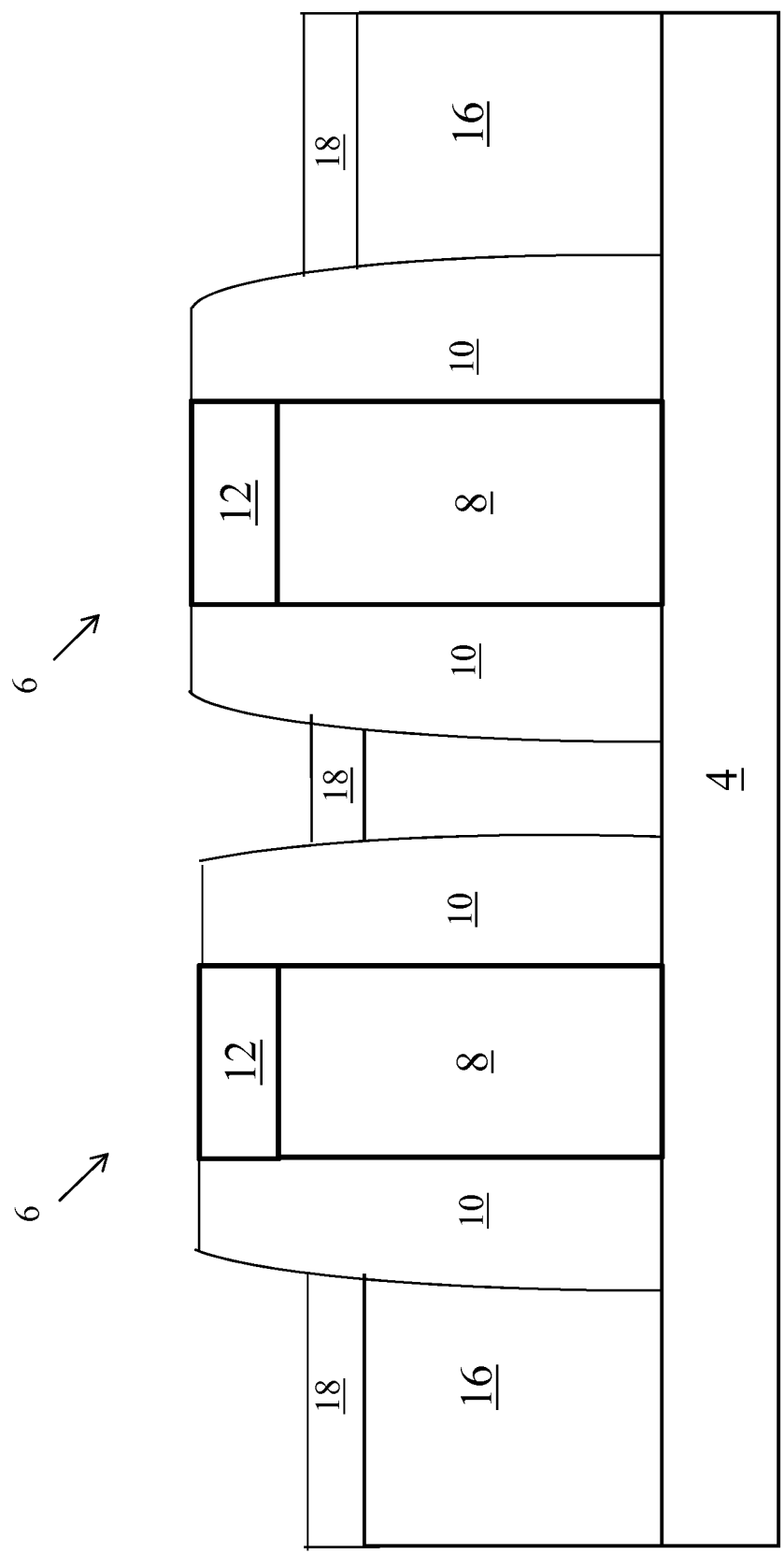

FIG. 4 illustrates another process according to various embodiments: forming a silicide layer 18 over the source-drain region 16 (or simply over the substrate 4 in the case that the source-drain region 16 is not formed in some embodiments). The silicide layer 18 can include a silicide in some cases, and can be blanket formed over the source-drain region 16. The silicide 18 can be formed by any conventional silicide formation techniques known in the art, and the silicide 18 can be formed while masking to shield the at least one gate structure 6 in some embodiments. It is understood that in various embodiments, forming of the silicide 18 is optional. That is, in some cases, the conductor 20 (FIG. 5) can be formed directly over the substrate 4, the raised source-drain region 16 or the silicide layer 18, depending upon whether the raised source-drain 16 and/or the silicide 18 are formed over the substrate 4.

Figure 5:
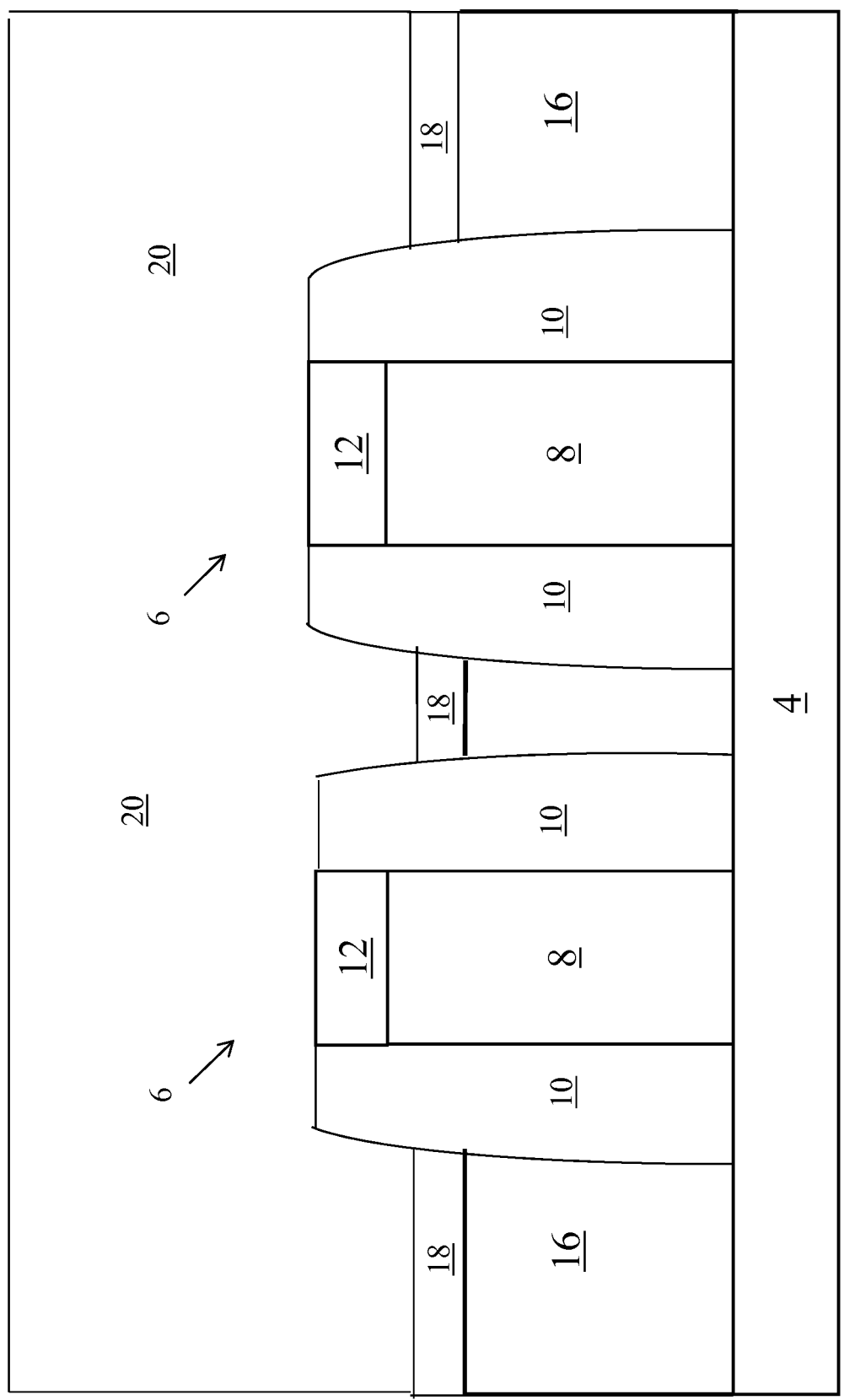

FIG. 5 illustrates another process according to various embodiments: forming a conductor 20 over the silicide 18 and the at least one gate structure 6. According to various embodiments of the invention, the conductor 20 is blanket-formed over the silicide 18 (or raised source-drain 16, or substrate 4) and the at least one gate structure 6. In various embodiments, the conductor 20 includes tungsten (W), which is blanket-deposited over the entirety of the silicide 18 and the at least one gate structure 6. That is, the conductor 20 can be deposited to completely cover the silicide 18 as well as the at least one gate structure 6.

Figure 6:
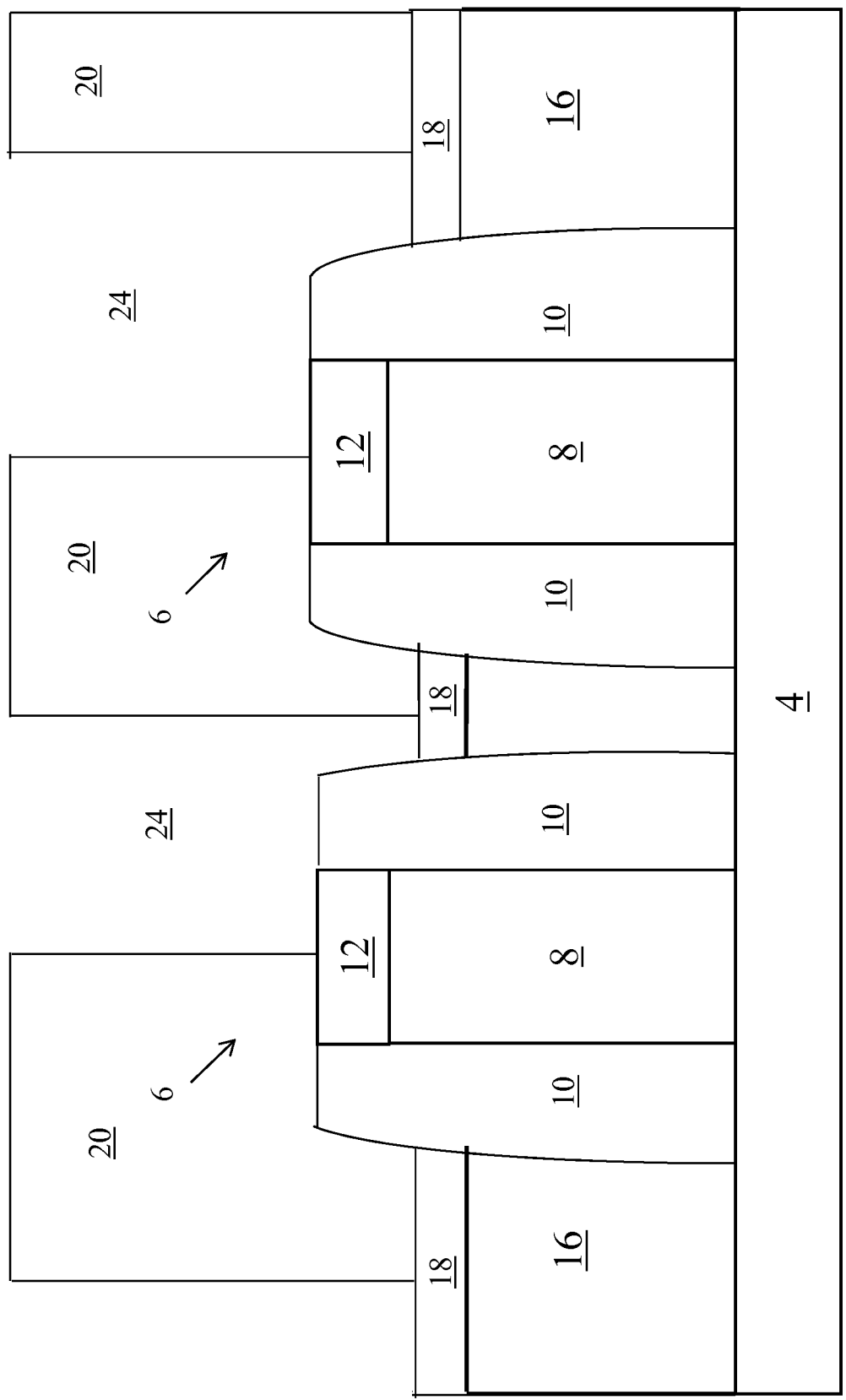

FIG. 6 illustrates another process according to various embodiments: forming an opening in the conductor 20 to expose the gate structure 6. In this case, the conductor can be masked and selectively removed (e.g., using conventional selective etching techniques), to expose the gate structure 6, in particular, the RMG cap 12 and a spacer 10 without exposing the gate region 8. As noted, this process can be selective so as to avoid etching through the RMG cap 12 and/or the spacer 10.

Figure 7:
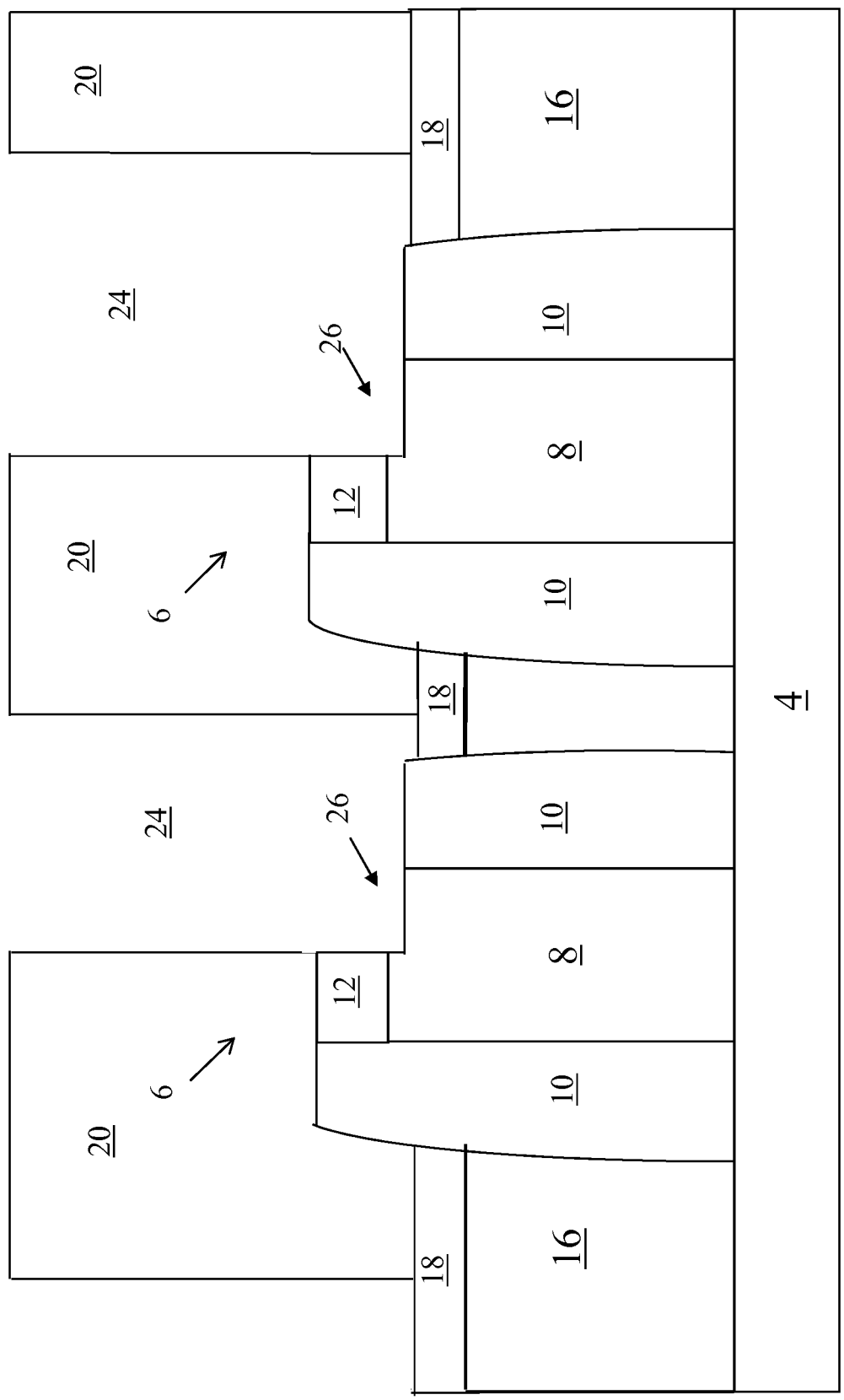
Figure 8:
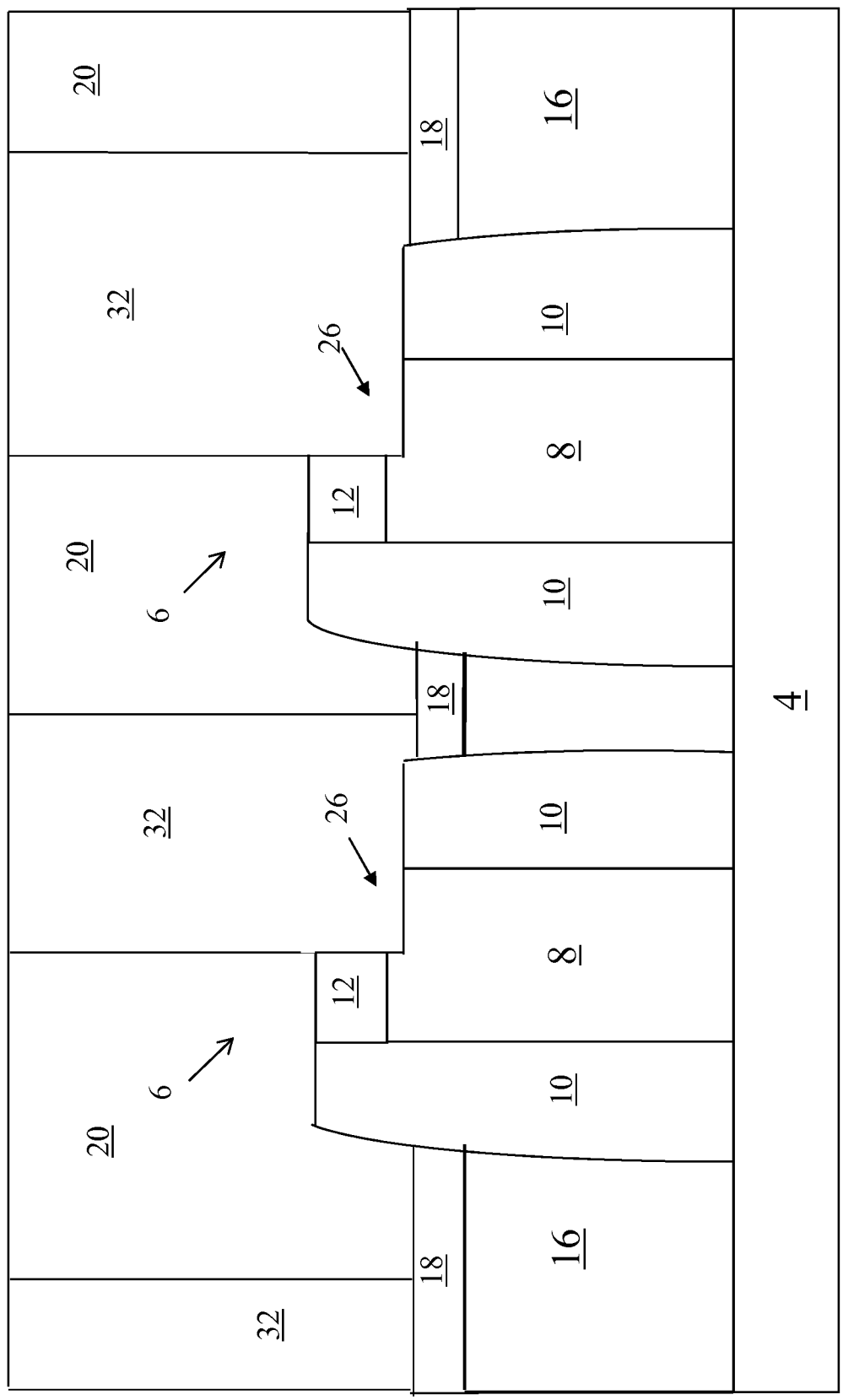
FIG. 8 depicts a cross-sectional schematic view of a semiconductor structure formed according to various embodiments of the invention.

FIG. 7 illustrates another process, which can be performed after the process shown in FIG. 6, and can include forming an opening in the RMG cap 12 and at least one of the spacers 10 to expose a portion of the gate region 8. In this case, the RMG cap 12 and at least one of the spacers 10 can be non-selectively etched to remove a portion of the cap 12 and the spacer 10, along with a portion of the underlying gate region 8. The processes shown and described with reference to FIGS. 6-7 allow for formation of openings 24 which expose a first portion (surface) 26 of the gate region 8 while leaving a second portion 28 of the gate region 8 covered by the RMG cap 12.

FIG. 8 shows a semiconductor structure 30 formed after an additional process of forming a dielectric 32 in the opening 24 in the conductor 20 (e.g., contacting a portion of the gate region 8), and an optional process of planarizing the dielectric 32 and/or the conductor 20. The dielectric 32 can be deposited and subsequently planarized (e.g., via conventional chemical-mechanical planarization) via a conventional damascene process. In various embodiments, the dielectric 32 can include an interlayer dielectric having one or more conventional dielectric materials such as: silicon nitride (Si3N4), silicon oxide (SiO2), fluorinated SiO2 (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

It is understood that the remaining portions of the conductor 20 directly contact the damascene dielectric 32 (e.g., ILD) without a contact liner therebetween. This allows for implementation of contacts to underlying layers while alleviating some of the space constraint-related issues from conventional approaches. As shown and described herein, formation of the semiconductor structure 30 is performed by blanket-forming the contact layer prior to the dielectric used at the same level. This process is in contrast to the conventional approaches, and helps to avoid shorting between contacts and gates, a problem associated with the conventional approaches.

As shown in FIG. 8, the semiconductor structure 30 can include: a substrate 4; at least one gate structure 6 overlying the substrate 4, the at least one gate structure 6 having: a gate region 8 contacting the substrate 4; a set of spacers 10 adjacent to the gate region 8 and contacting the substrate 4; and a replacement metal gate (RMG) cap 12 overlying a first portion 28 of the gate region 8 between the set of spacers 10; a contact layer 20 contacting the RMG cap 12 and at least one of the set of spacers 10; and a dielectric 32 contacting a second portion 26 of the gate region 8 between the set of spacers 10, the dielectric 32 extending beyond the RMG cap 12 to contact the second portion 26 of the gate region 8. Also shown, in some embodiments, the semiconductor structure can include a source-drain region 16 (e.g., a raised source-drain region) overlying the substrate 4 and substantially surrounding the at least one gate structure 6.

Figure 9:
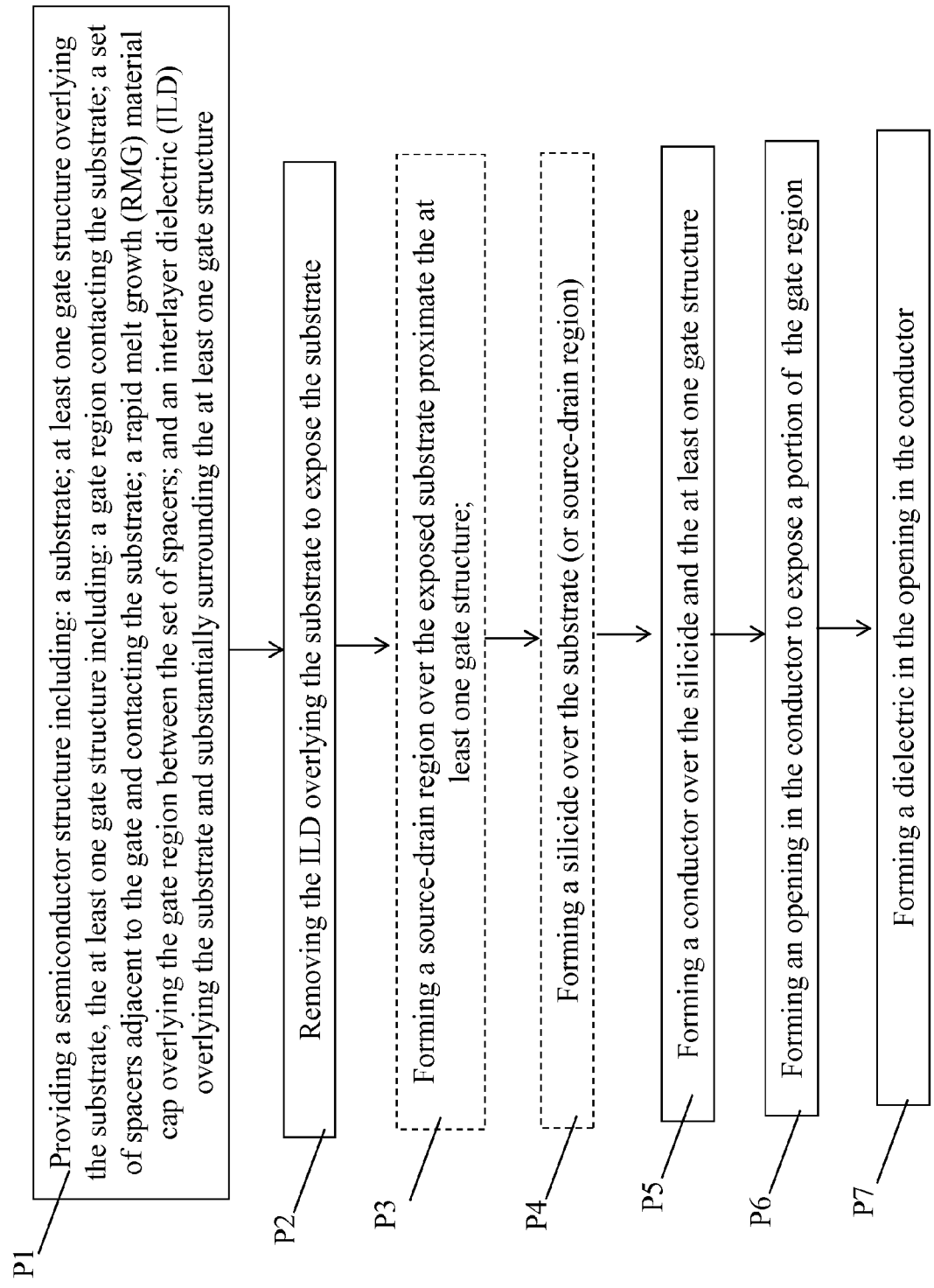
FIG. 9 depicts a flow chart illustrating a process of forming a semiconductor structure according to various embodiments of the invention.

FIG. 9 shows an illustrative flow diagram which depicts processes according to various embodiments of the invention. As shown, a method according to various embodiments can include:

Process P1: providing a semiconductor structure including: a substrate; at least one gate structure overlying the substrate, the at least one gate structure having: a gate region contacting the substrate; a set of spacers adjacent to the gate region and contacting the substrate; a replacement metal gate (RMG) material cap overlying the gate region between the set of spacers; and an interlayer dielectric (ILD) overlying the substrate and substantially surrounding the at least one gate structure;

Process P2: removing the ILD overlying the substrate to expose the substrate;

Process P3 (optionally): forming a source-drain region over the exposed substrate proximate the at least one gate structure;

Process P4 (optionally): forming a silicide over the source-drain region;

Process P5: forming a conductor over the silicide and the at least one gate structure;

Process P6: forming an opening in the conductor to expose a portion of the gate region; and Process P7: forming a dielectric in the opening in the conductor (e.g., contacting the previously exposed portion of gate region).

Figure 10:
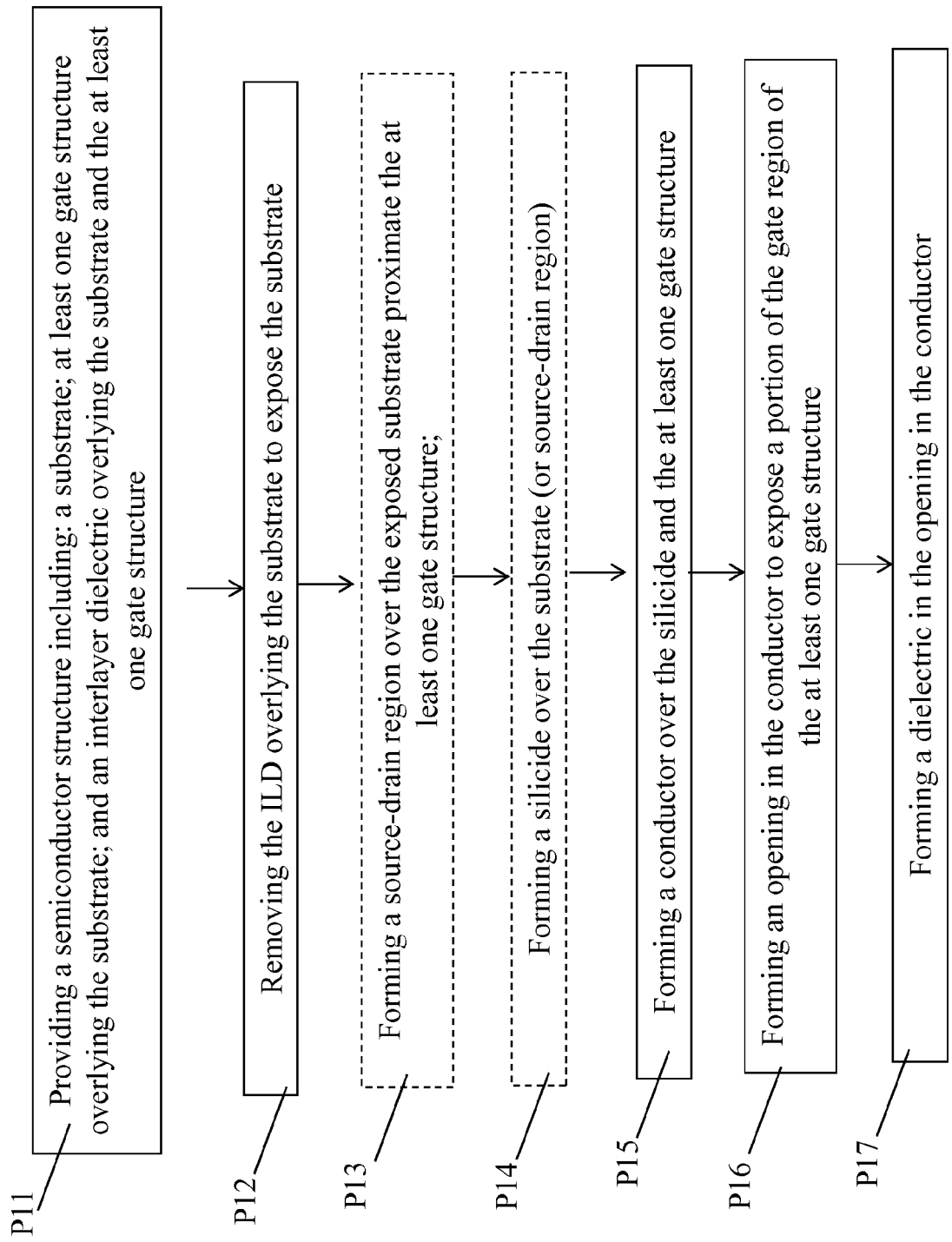
FIG. 10 depicts a flow chart illustrating an alternative process of forming a semiconductor structure according to various embodiments of the invention.

FIG. 10 shows an illustrative flow diagram which depicts processes according to various alternative embodiments of the invention. As shown, a method according to these various alternative embodiments can include:

Process P11: providing a semiconductor structure including: a substrate; at least one gate structure overlying the substrate; and an interlayer dielectric overlying the substrate and the at least one gate structure;

Process P12: removing the ILD overlying the substrate to expose the substrate;

Process P13 (optionally): forming a source-drain region over the exposed substrate proximate the at least one gate structure;

Process P14 (optionally): forming a cap over the source-drain region;

Process P15: forming a conductor over the silicide and the at least one gate structure;

Process P16: forming an opening in the conductor to expose a portion of a gate region of the at least one gate structure; and Process P17: forming a dielectric in the opening in the conductor (e.g., contacting the previously exposed portion of the gate region).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method comprising: providing a semiconductor structure including:
   a substrate;
   at least one gate structure overlying the substrate, the at least one gate structure having:
   a gate region contacting the substrate;
   a set of spacers adjacent to the gate region and contacting the substrate;
   a replacement metal gate (RMG) cap overlying the gate region between the set of spacers; and
   an interlayer dielectric (ILD) overlying the substrate and substantially surrounding the at least one gate structure;
   removing the ILD overlying the substrate to expose the substrate; forming a silicide layer over the substrate;
   forming a conductor over the silicide layer and the at least one gate structure;
   forming an opening in the conductor to expose a portion of the gate region; and
   forming a dielectric in the opening in the conductor;
   further comprising forming a raised source-drain region over the exposed substrate proximate the at least one gate structure after the removing of the ILD and prior to the forming of the silicide layer over the substrate;
   wherein the forming of the silicide layer over the substrate includes forming the silicide layer over the raised source-drain region.

2. A method comprising:
   providing a semiconductor structure including:
   a substrate;
   at least one gate structure overlying the substrate; and
   an interlayer dielectric (ILD) overlying the substrate and the at least one gate structure;
   removing the ILD overlying the substrate to expose the substrate;
   forming a raised source-drain region over the exposed substrate proximate the at least one gate structure;
   forming a silicide layer over the source-drain region;
   forming a conductor over the silicide layer and the at least one gate structure;
   forming an opening in the conductor to expose a portion of a gate region of the at least one gate structure; and
   forming a dielectric in the opening in the conductor.

3. The method of claim 2, wherein the forming of the opening in the conductor to expose the portion of the gate region includes:
   selectively forming the opening in the conductor to expose a cap overlying the gate region without exposing the gate region; and
   non-selectively etching the cap and at least one spacer adjacent the gate region to expose the portion of the gate region.

4. The method of claim 3, wherein the selectively forming of the opening includes selectively etching the conductor.

5. The method of claim 2, wherein the non-selectively etching of the cap is performed after the selective etching of the conductor.

6. The method of claim 2, wherein the forming of the conductor includes blanket depositing the conductor over the at least one gate structure.

7. The method of claim 2, wherein the forming of the dielectric in the opening in the conductor includes depositing the dielectric in the opening in the conductor.

8. The method of claim 2, further comprising:
   planarizing the dielectric after the forming of the dielectric in the opening.

* * * * *